(12) United States Patent
Lee

(10) Patent No.: US 8,246,373 B2
(45) Date of Patent: Aug. 21, 2012

(54) MOUNTING APPARATUS FOR EXPANSION CARD

(75) Inventor: Kun-Lin Lee, New Taipei (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/191,477

(22) Filed: Jul. 27, 2011

(65) Prior Publication Data

US 2012/0178276 A1 Jul. 12, 2012

(30) Foreign Application Priority Data

Jan. 10, 2011 (TW) .............................. 100100758 A

(51) Int. Cl.
*H01R 13/62* (2006.01)

(52) U.S. Cl. ........................................ 439/327; 439/153

(58) Field of Classification Search .................. 439/327, 439/371, 153, 154
See application file for complete search history.

(56) References Cited

U.S. PATENT DOCUMENTS

| 6,056,574 | A | * | 5/2000 | Yeomans et al. | 439/327 |
| 6,074,231 | A | * | 6/2000 | Ju | 439/327 |
| 6,305,964 | B1 | * | 10/2001 | Pon et al. | 439/327 |
| 6,319,037 | B1 | * | 11/2001 | Lai | 439/327 |
| 6,394,831 | B1 | * | 5/2002 | Bowers et al. | 439/327 |
| 6,887,095 | B2 | * | 5/2005 | Simon et al. | 439/488 |
| 7,287,996 | B1 | * | 10/2007 | Shing | 439/327 |
| 7,670,165 | B2 | * | 3/2010 | Wu et al. | 439/327 |

* cited by examiner

*Primary Examiner* — Tulsidas C Patel
*Assistant Examiner* — Travis Chambers
(74) *Attorney, Agent, or Firm* — Altis Law Group, Inc.

(57) ABSTRACT

A mounting apparatus for fixing an expansion card to an expansion socket with two latching members pivotably mounted to opposite ends of the expansion socket to engage with the expansion card, includes two engaging blocks attached to the opposite ends of the expansion socket below the latching members, and a fixing bracket attached to a side of the expansion socket. The fixing bracket includes two latching portions respectively formed from opposite ends of the fixing bracket, to correspondingly latch the engaging blocks, thus making tops of the engaging blocks resisting against bottoms of the latching members to prevent the latching members from pivoting.

7 Claims, 3 Drawing Sheets

MOUNTING APPARATUS FOR EXPANSION CARD

BACKGROUND

1. Technical Field

The present disclosure relates to mounting apparatuses and, more particularly, to a mounting apparatus for an expansion card.

2. Description of Related Art

An expansion card, such as a memory card, is often installed in an expansion socket of a motherboard. Two latching members are pivotably attached to two opposite ends of the expansion socket. Each latching member includes a latch portion for latching the memory card. However, the motherboard may vibrate during testing, which may cause the latch portion to be detached from the memory card.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

Figure 1:
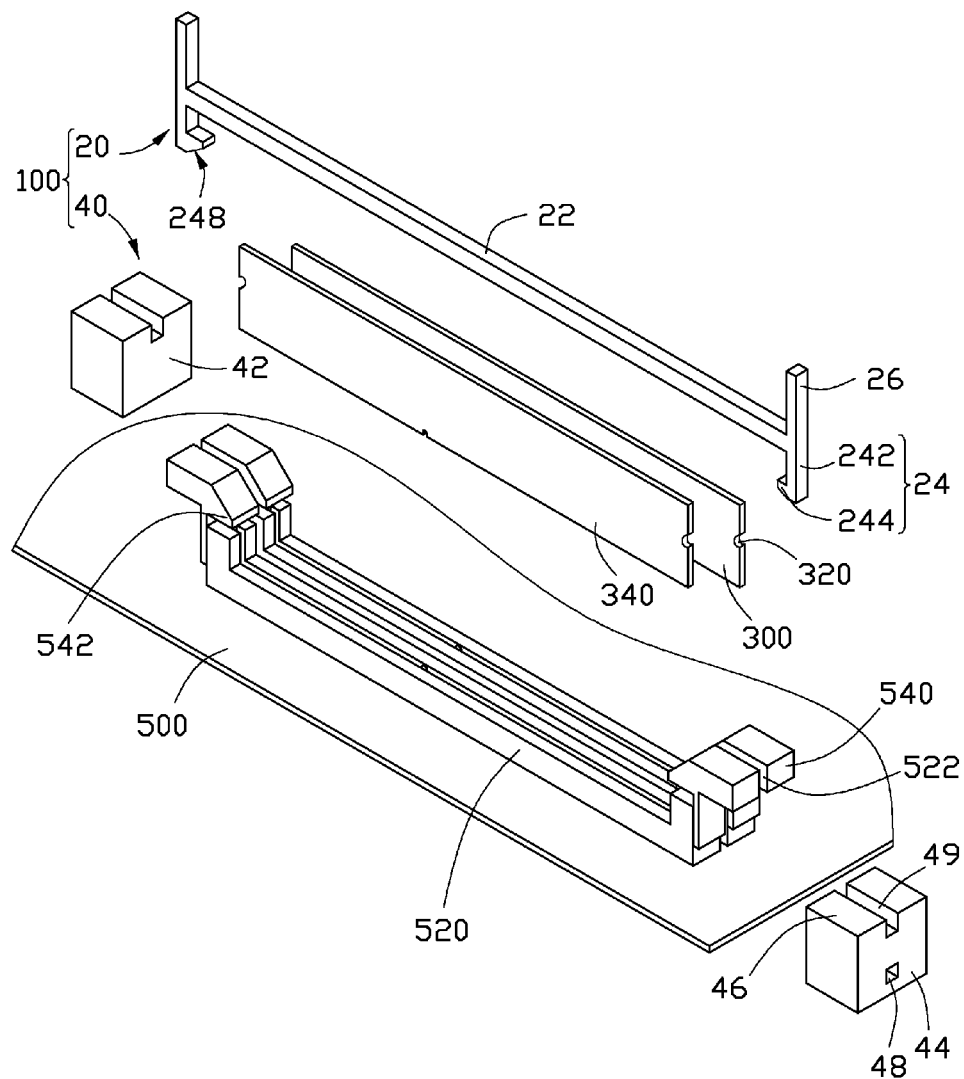
FIG. 1 is an exploded, isometric view of an embodiment of a mounting apparatus, together with a motherboard and two expansion cards.

Referring to FIG. 1, an embodiment of a mounting apparatus 100 is provided for fixing two expansion cards, such as memory cards 300, to two expansion sockets 520 of a motherboard 500, respectively. Each memory card 300 includes a plug portion 340 at a bottom of the memory card 300, and defines two cutouts 320 in two opposite ends of the memory card 300 and above the plug portion 340. Two expansion sockets 520 are installed on the motherboard 500 and are parallel to each other. A receiving groove 522 is defined between the expansion sockets 520. Two latching members 540 are pivotably mounted to two opposite ends of each expansion socket 520, respectively. Each latching member 540 includes an engaging portion 542 protruding from a top of the latching member 540 towards the expansion socket 520. The mounting apparatus 100 includes a fixing bracket 20 and two engaging blocks 40. In the illustrated embodiment, the motherboard 500 is fixed in a computer (not shown), and only a portion of the motherboard 500 is shown.

The fixing bracket 20 includes a substantially bar-shaped beam 22, two latching portions 24 respectively extending down from two opposite ends of the beam 22, and two operating portions 26 respectively extending up from the ends of the beam 22 away from the corresponding latching portions 24. Each latching portion 24 includes a resilient connecting portion 242 extending down in a substantially perpendicular direction from the beam 22, and a hook 244 extending from a distal end of the connecting portion 242 toward the other latching portion 24. A bottom surface of each hook 244 forms a slanted guiding surface 248. In the embodiment, the fixing bracket 20 is made of resilient material, such as plastic, and is integrally formed.

Each engaging block 40 is substantially rectangular, and includes an inner surface 42 facing the expansion socket 520, an outer surface 44 opposing the inner surface 42, and a top surface 46 connected in a substantially perpendicular direction between the tops of the inner surface 42 and the outer surface 44. A latching hole 48 is defined in the outer surface 44. A positioning slot 49 is defined in the top surface 46, corresponding to the receiving groove 522. Two opposite ends of the positioning slot 49 respectively extend through the inner surface 42 and the outer surface 44, above the latching hole 48.

Figure 2:
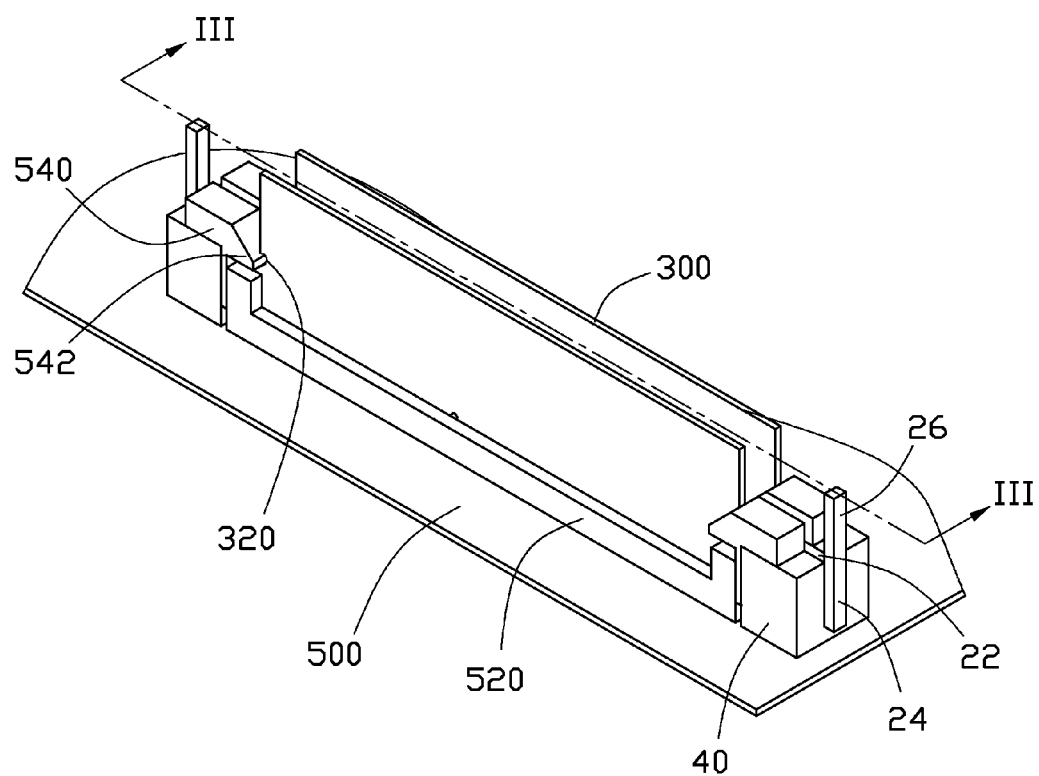
FIG. 2 is an assembled, isometric view of FIG. 1.
Figure 3:
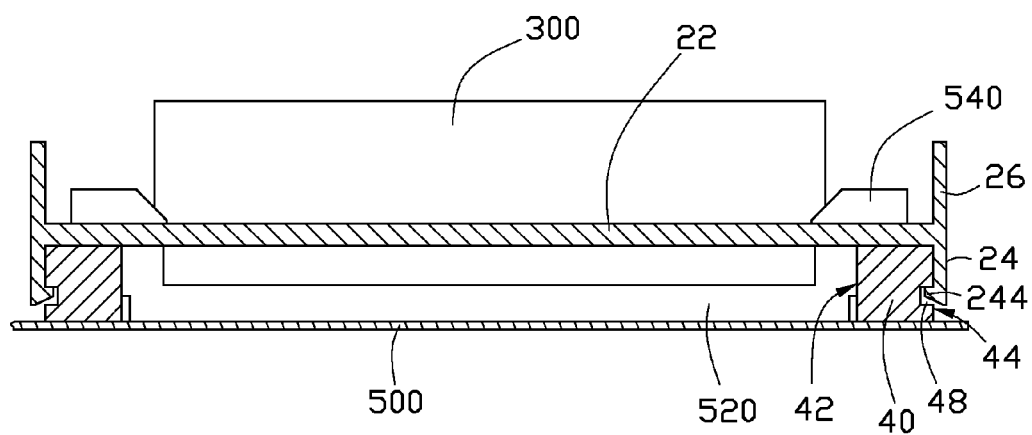
FIG. 3 is a sectional view of FIG. 2, taken along the line of III-III.

Referring to FIGS. 2 and 3, in assembly, the memory cards 300 are respectively attached to the expansion sockets 520 through the plug portions 340. The latching members 540 are pivoted toward the memory cards 300. First ends of the engaging portions 542 are engaged in the cutouts 320 of the memory cards 300, respectively. The engaging blocks 40 are respectively supported on the motherboard 500 below second ends of the engaging portions 542. The inner surfaces 42 face the corresponding ends of the expansion sockets 520, and the positioning slot 49 of each engaging black 40 is aligned with the receiving groove 522. The beam 22 of the fixing bracket 20 is received in the receiving groove 522. The hooks 244 respectively resist against the bottoms of positioning slots 49 adjacent to the outer surfaces 44. The operating portions 26 of the fixing bracket 20 are operated to move the fixing bracket 20 down, thereby deforming the connecting portions 242 away from each other. The guiding surfaces 248 of the hooks 244 respectively abut against the outer surfaces 44 of the engaging blocks 40. The hooks 244 are respectively inserted into the latching holes 48 of the engaging blocks 40. The top surfaces 46 of the engaging blocks 40 respectively resist against the bottoms of engaging portions 542, to prevent the latching members 540 from pivoting. Therefore, the first ends of the engaging portions 542 are firmly engaged in the cutouts 320 of the memory cards 300.

In the disassembling of the mounting apparatus 100, the operating portions 26 are operated to move towards each other, thereby deforming the connecting portions 242 away from each other. The hooks 244 are respectively disengaged from the latching holes 48 of the engaging blocks 40. Thus, the fixing bracket 20 becomes ready to be taken out of the receiving groove 522.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus for fixing an expansion card to an expansion socket, two latching members pivotably mounted to opposite ends of the expansion socket to engage with the expansion card, the mounting apparatus comprising:

two engaging blocks attached to the opposite ends of the expansion socket below the latching members; and a fixing bracket attached to a side of the expansion socket, the fixing bracket comprising two latching portions respectively formed from opposite ends of the fixing bracket, to correspondingly latch the engaging blocks, and make the engaging blocks resisting against bottoms of the latching members to prevent the latching members from pivoting.

2. The mounting apparatus of claim 1, wherein each engaging block is substantially rectangular, and comprises an inner surface facing the expansion socket, an outer surface opposite to the inner surface, and a top surface connected between tops of the inner surface and the outer surface, the top surface resists against the bottom of the corresponding latching member, the latching member defines a latching hole is in the outer surface, the fixing bracket comprises a substantially bar-shaped beam attached to the side of the expansion socket, and two latching portions respectively extending down from two opposite ends of the beam, each latching portion comprises a resilient connecting portion extending down from the beam, and a hook extending from a distal end of the connecting portion toward the other latching portion to be insert into the latching hole of the corresponding engaging black.

3. The mounting apparatus of claim 2, wherein the fixing bracket further comprises two operating portions respectively extending up from the ends of the beam away from the corresponding latching portions, the operating portions are operable to move towards each other to deform the connecting portions away from each other.

4. The mounting apparatus of claim 2, wherein a bottom surface of each hook forms a slanted guiding surface.

5. The mounting apparatus of claim 4, wherein a positioning slot is defined in the top surface above the corresponding latching hole, with two opposite ends of the positioning slot respectively extend through the inner surface and the outer surface, two opposite ends of the beam are respectively received in the positioning slots of the engaging blocks.

6. The mounting apparatus of claim 1, wherein the fixing bracket is made of plastic.

7. The mounting apparatus of claim 6, wherein the fixing bracket is integrally formed.

* * * * *